United States Patent
Yeung et al.

(10) Patent No.: US 10,957,763 B2
(45) Date of Patent: Mar. 23, 2021

(54) GATE FILL UTILIZING REPLACEMENT SPACER

(71) Applicant: International Business Machines Corporation, Armonk, NY (US)

(72) Inventors: Chun W. Yeung, Niskayuna, NY (US); Chen Zhang, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/253,721

(22) Filed: Jan. 22, 2019

(65) Prior Publication Data

US 2019/0157390 A1 May 23, 2019

Related U.S. Application Data

(63) Continuation of application No. 15/491,565, filed on Apr. 19, 2017, now Pat. No. 10,297,663.

(51) Int. Cl.
*H01L 29/06* (2006.01)
*H01L 29/66* (2006.01)
(Continued)

(52) U.S. Cl.
CPC .......... *H01L 29/0665* (2013.01); *B82Y 10/00* (2013.01); *H01L 21/02532* (2013.01); *H01L 21/02603* (2013.01); *H01L 21/823814* (2013.01); *H01L 29/0669* (2013.01); *H01L 29/0673* (2013.01); *H01L 29/165* (2013.01); *H01L 29/401* (2013.01); *H01L 29/41783* (2013.01); *H01L 29/42376* (2013.01);
(Continued)

(58) Field of Classification Search
CPC .......... H01L 29/0665; H01L 29/66795; H01L 29/785; H01L 27/1211; H01L 27/0886; H01L 2924/1307; H01L 29/41783; B82Y 10/00

See application file for complete search history.

(56) References Cited

U.S. PATENT DOCUMENTS 7,592,650 B2   9/2009  Hshieh
7,807,536 B2   10/2010 Sreekantham et al.
(Continued)

OTHER PUBLICATIONS

List of IBM Patents or Patent Applications Treated as Related.

*Primary Examiner* — Thanhha S Pham
(74) *Attorney, Agent, or Firm* — Robert Sullivan; Ryan, Mason & Lewis, LLP

(57) ABSTRACT

A semiconductor structure includes a substrate and a channel stack disposed over a portion of a top surface of the substrate, the channel stack including two or more nanosheet channels, inner spacers disposed above and below outer edges of the two or more nanosheet channels, work function metal disposed between the inner spacers above and below each of the two or more nanosheet channels, and a dielectric layer disposed between the work function metal and the inner spacers and two or more nanosheet channels. The semiconductor structure further includes source/drain regions disposed over the top surface of the substrate surrounding the channel stack and a gate region disposed over a top surface of the channel stack, the gate region including the work function metal and a gate metal disposed over the work function metal. The semiconductor structure further includes a capping layer and contacts.

20 Claims, 8 Drawing Sheets

(51) Int. Cl.
*H01L 29/417* (2006.01)
*H01L 29/78* (2006.01)
*B82Y 10/00* (2011.01)
*H01L 29/423* (2006.01)
*H01L 29/786* (2006.01)
*H01L 21/02* (2006.01)
*H01L 21/8238* (2006.01)
*H01L 29/165* (2006.01)
*H01L 29/775* (2006.01)
*H01L 29/49* (2006.01)
*H01L 29/40* (2006.01)

(52) U.S. Cl.
CPC ...... *H01L 29/42392* (2013.01); *H01L 29/495* (2013.01); *H01L 29/4958* (2013.01); *H01L 29/4966* (2013.01); *H01L 29/6653* (2013.01); *H01L 29/6656* (2013.01); *H01L 29/6681* (2013.01); *H01L 29/66439* (2013.01); *H01L 29/66545* (2013.01); *H01L 29/66553* (2013.01); *H01L 29/66772* (2013.01); *H01L 29/66795* (2013.01); *H01L 29/775* (2013.01); *H01L 29/78* (2013.01); *H01L 29/785* (2013.01); *H01L 29/7848* (2013.01); *H01L 29/78654* (2013.01); *H01L 29/78696* (2013.01)

(56) References Cited

U.S. PATENT DOCUMENTS

| | | |
|---|---|---|
| 8,779,514 B2 | 7/2014 | Liang et al. |
| 9,111,907 B2 | 8/2015 | Kamineni et al. |
| 9,136,333 B2 | 9/2015 | Aoki et al. |
| 9,240,447 B1 | 1/2016 | Cheng et al. |
| 9,287,403 B1 | 3/2016 | Lee et al. |
| 9,318,552 B2 | 4/2016 | Xie et al. |
| 9,362,355 B1 | 6/2016 | Cheng et al. |
| 9,647,139 B2 | 5/2017 | Doris et al. |
| 9,653,289 B1 | 5/2017 | Balakrishnan et al. |
| 10,074,730 B2 | 9/2018 | Bergendahl et al. |
| 2004/0063286 A1 | 4/2004 | Kim et al. |
| 2006/0273382 A1 | 12/2006 | Hshieh |
| 2007/0190728 A1 | 8/2007 | Sreekantham et al. |
| 2012/0139042 A1 | 6/2012 | Fu et al. |
| 2014/0001441 A1* | 1/2014 | Kim ............... H01L 21/30604 257/29 |
| 2014/0151639 A1 | 6/2014 | Chang et al. |
| 2014/0231885 A1 | 8/2014 | Xie et al. |
| 2014/0339611 A1 | 11/2014 | Leobandung |
| 2015/0064897 A1 | 3/2015 | Balocco et al. |
| 2015/0340457 A1 | 11/2015 | Xie et al. |
| 2015/0372104 A1 | 12/2015 | Liu et al. |
| 2015/0372115 A1 | 12/2015 | Koh et al. |
| 2016/0118480 A1 | 4/2016 | Xie et al. |
| 2016/0190137 A1 | 6/2016 | Tsai et al. |
| 2016/0365411 A1 | 12/2016 | Yeh et al. |
| 2017/0005195 A1 | 1/2017 | Ching et al. |
| 2017/0018462 A1 | 1/2017 | Suk et al. |
| 2017/0040321 A1 | 2/2017 | Mitard |
| 2017/0110541 A1 | 4/2017 | Xu et al. |
| 2017/0141212 A1 | 5/2017 | Barraud et al. |
| 2017/0194213 A1 | 7/2017 | Ching et al. |
| 2017/0221893 A1 | 8/2017 | Tak et al. |
| 2017/0250291 A1* | 8/2017 | Lee ............... H01L 29/66545 |
| 2017/0256609 A1 | 9/2017 | Bhuwalka et al. |
| 2017/0263728 A1 | 9/2017 | Kittl et al. |
| 2017/0288018 A1* | 10/2017 | Tung ............. H01L 29/66439 |
| 2018/0033797 A1* | 2/2018 | Colinge ......... H01L 29/66772 |
| 2018/0108733 A1 | 4/2018 | Augendre et al. |
| 2018/0114834 A1 | 4/2018 | Cheng et al. |
| 2018/0175163 A1 | 6/2018 | Barraud et al. |
| 2018/0175167 A1 | 6/2018 | Reboh et al. |

\* cited by examiner

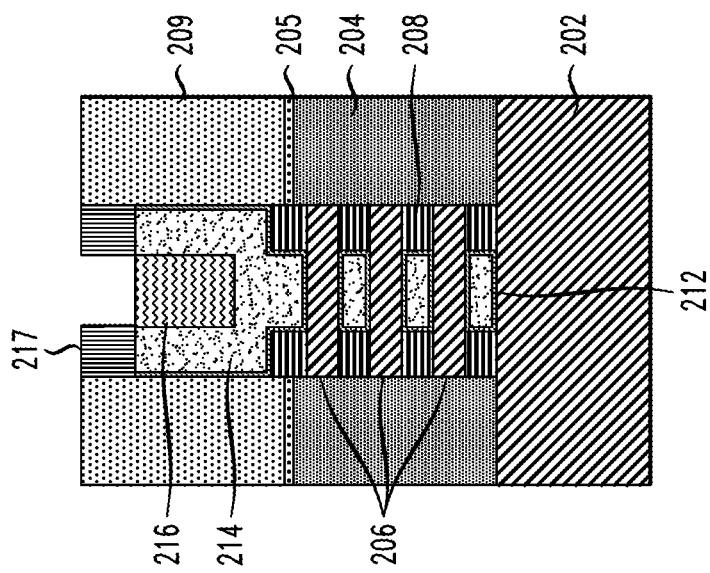
FIG. 8
800
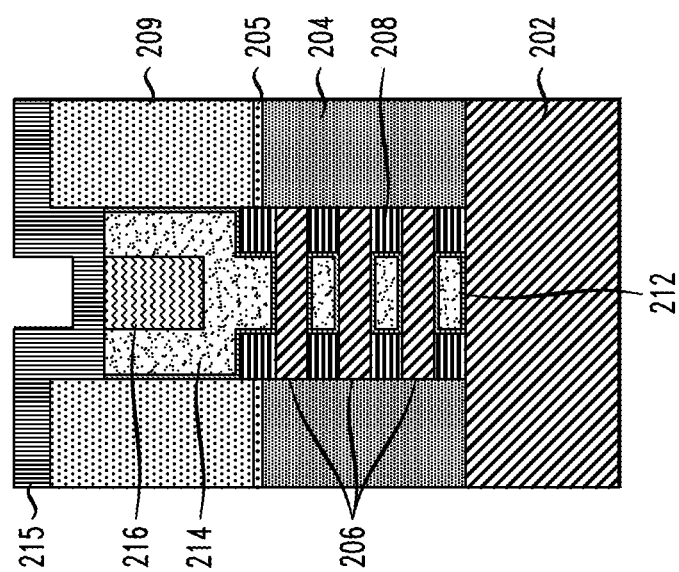
FIG. 7
700
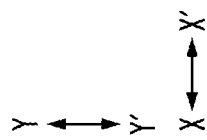

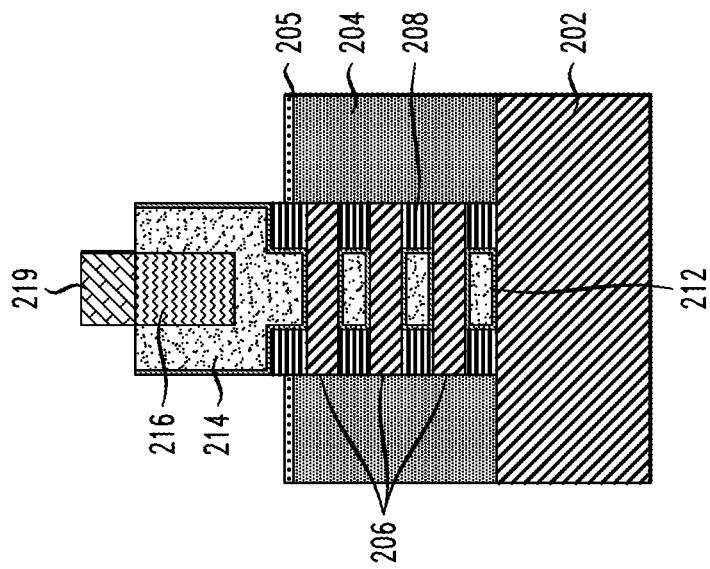
FIG. 10
1000
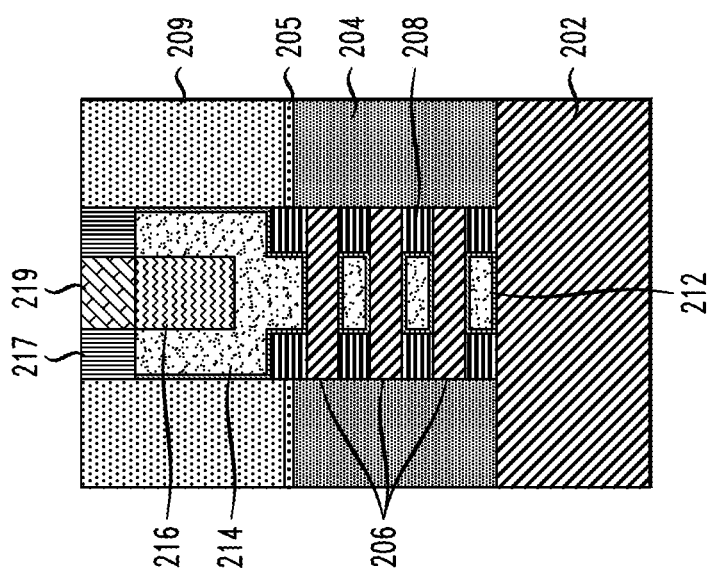
FIG. 9
900
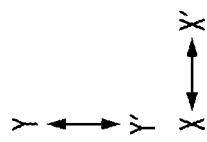

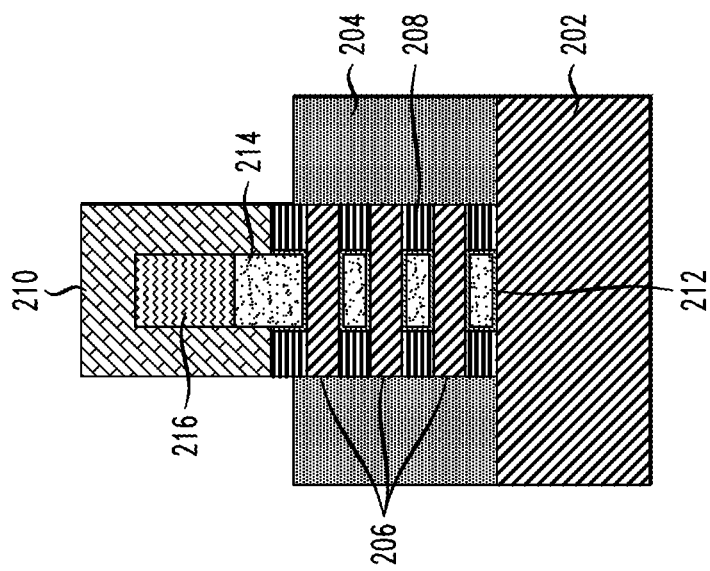
FIG. 12
1200
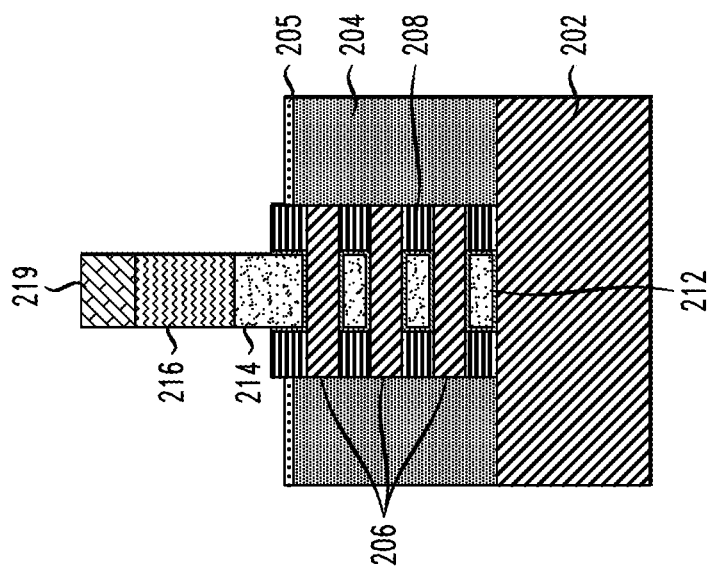
FIG. 11
1100
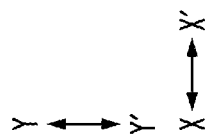

1300

US 10,957,763 B2

1

GATE FILL UTILIZING REPLACEMENT SPACER

BACKGROUND

The present application relates to semiconductors, and more specifically, to techniques for forming semiconductor structures. Semiconductor devices such as metal-oxide-semiconductor field-effect transistors (MOSFETs) may utilize nanosheet technology, wherein the channel of a MOSFET device utilizes one or more layers of nanosheets. Each nanosheet has a vertical thickness substantially less than the width of that nanosheet. Gate structures may be formed above and below each nanosheet.

SUMMARY

Embodiments of the invention provide techniques for filling material in a gate of a nanosheet MOSFET using a replacement spacer, thereby reducing gate resistance.

For example, in one embodiment a method of forming a semiconductor structure comprises forming outer spacers surrounding a dummy gate, the dummy gate being disposed over a channel stack comprising two or more nanosheet channels and sacrificial layers formed above and below each of the two or more nanosheet channels. The method also comprises forming an oxide surrounding the outer spacers, the oxide being disposed over source/drain regions surrounding the channel stack. The method further comprises removing the dummy gate, removing the outer spacers, and performing a channel release to remove the sacrificial layers in the channel stack following removal of the outer spacers. The method further comprises performing conformal deposition of a dielectric layer and a work function metal on exposed portions of the oxide, and filling a gate metal over the channel stack, the gate metal being surrounded by the work function metal.

In another embodiment, a semiconductor structure comprises a substrate and a channel stack disposed over a portion of a top surface of the substrate, the channel stack comprising two or more nanosheet channels, inner spacers disposed above and below outer edges of the two or more nanosheet channels, work function metal disposed between the inner spacers above and below each of the two or more nanosheet channels, and dielectric disposed between the work function metal and the inner spacers and two or more nanosheet channels. The semiconductor structure also comprises source/drain regions disposed over the top surface of the substrate surrounding the channel stack and a gate region disposed over a top surface of the channel stack, the gate region comprising the work function metal and a gate metal disposed over the work function metal. The semiconductor structure further comprises a capping layer surrounding the gate region and contacts to the source/drain regions surrounding the capping layer.

In another embodiment, an integrated circuit comprises a semiconductor structure comprising a substrate and a channel stack disposed over a portion of a top surface of the substrate, the channel stack comprising two or more nanosheet channels, inner spacers disposed above and below outer edges of the two or more nanosheet channels, work function metal disposed between the inner spacers above and below each of the two or more nanosheet channels, and dielectric disposed between the work function metal and the inner spacers and two or more nanosheet channels. The semiconductor structure also comprises source/drain regions disposed over the top surface of the substrate surrounding

2 the channel stack and a gate region disposed over a top surface of the channel stack, the gate region comprising the work function metal and a gate metal disposed over the work function metal. The semiconductor structure further comprises a capping layer surrounding the gate region and contacts to the source/drain regions surrounding the capping layer.

BRIEF DESCRIPTION OF THE DRAWINGS

FIG. 7 depicts a cross-sectional view of the FIG. 6 structure following conformal deposition of an oxide, according to an embodiment of the present invention.

FIG. 8 depicts a cross-sectional view of the FIG. 7 structure following etching to form an oxide spacer, according to an embodiment of the present invention.

FIG. 9 depicts a cross-sectional view of the FIG. 8 structure following deposition of a capping layer, according to an embodiment of the present invention.

FIG. 10 depicts a cross-sectional view of the FIG. 9 structure following an oxide etch, according to an embodiment of the present invention.

FIG. 11 depicts a cross-sectional view of the FIG. 10 structure following etching of the dielectric and work functional metal, according to an embodiment of the present invention.

FIG. 12 depicts a cross-sectional view of the FIG. 11 structure following forming of a spacer, according to an embodiment of the present invention.

DETAILED DESCRIPTION

Illustrative embodiments of the invention may be described herein in the context of illustrative methods for filling material in a gate of a nanosheet MOSFET using a replacement spacer, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

It is advantageous to reduce the size of MOSFET devices, such as nanosheet MOSFET devices. As the size of such devices is reduced or further scaled, however, challenges are posed for formation of such structures. For example, contacted poly pitch (CPP) scaling to 7 nanometers (nm) and beyond can pose challenges for filling tungsten (W) or another low resistance material in a metal gate to reduce gate resistance. For 5 nm stacking nanosheet technology, CPP is approximately 38 nm. After formation of spacers, high-k dielectrics, work function metal (WFM) and source/drain contacts, there may be little or no room to fill W or another low resistance material in the gate.

Figure 1:
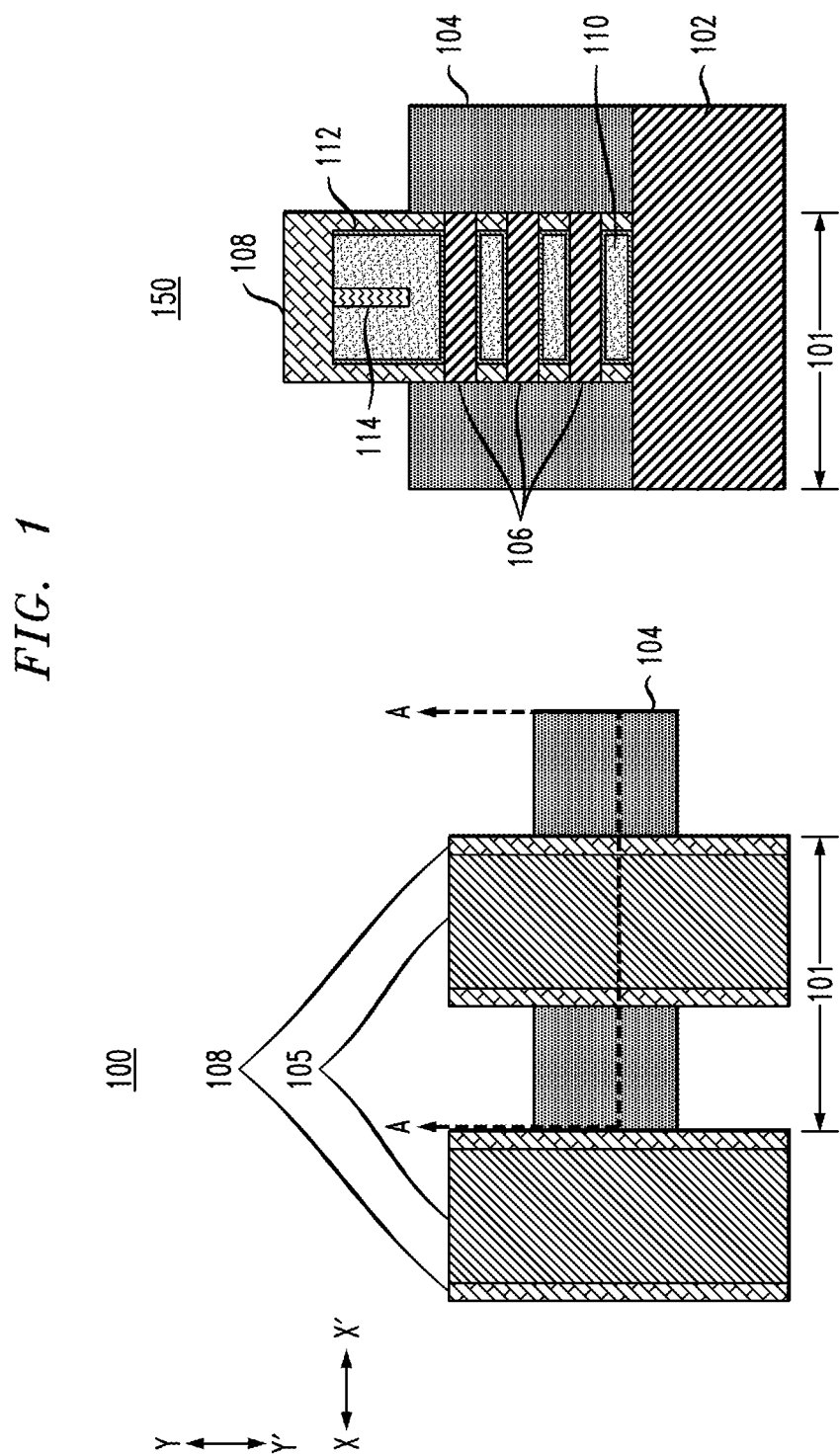
FIG. 1 depicts a top down view and a cross-sectional view of a MOSFET structure having low resistance material filled in a gate region, according to an embodiment of the present invention.

FIG. 1 shows a top-down view 100 of a structure, along with a cross-sectional view 150 of that structure taken along the line A-A. The structure comprises a stacked nanowire MOSFET. The top-down view 100 more particularly shows source/drain regions 104 and gates 105, including spacers 108 surrounding the gates 105. The CPP is labeled as 101.

The cross-sectional view 150, which may be viewed as a cross-section of the nanosheets, shows a substrate 102, source/drain regions 104, nanosheet channels or nanowires 106, spacer 108, dielectric layer 110 and WFM 112. The nanosheet channels 106 each provide a channel region connecting the source/drain regions 104 formed on either side of the nanosheet channels 106. The gate region surrounds each of the nanowires 106, and includes spacer 108, dielectric layer 110 and WFM 112. A low resistance metal 114, such as W, is filled in the gate. As illustrated, as the CPP 101 scales further, there is little room to form the low resistance metal 114 to reduce the gate resistance.

Figure 2:
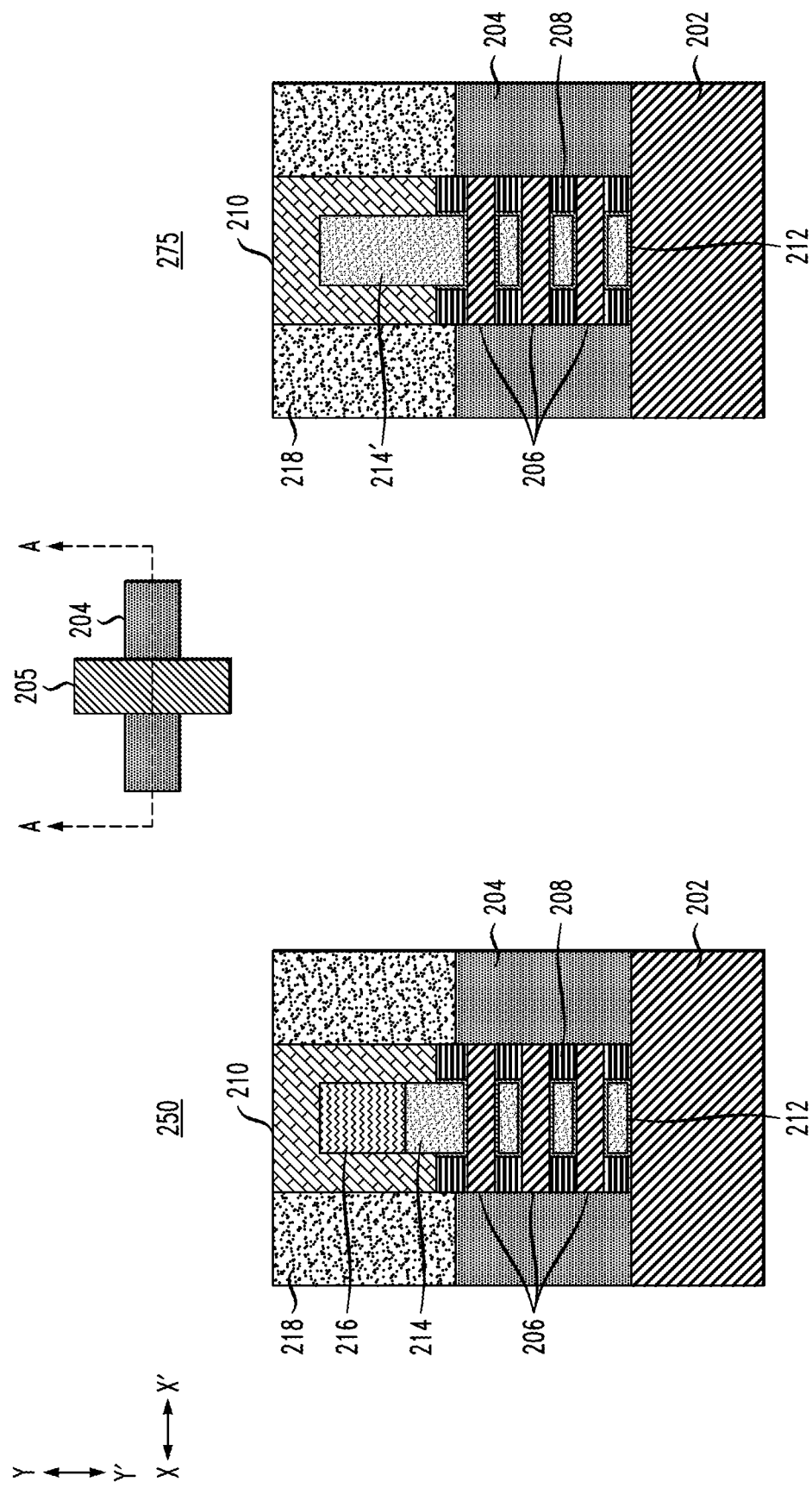
FIG. 2 depicts a top down view and first and second cross-sectional views of a MOSFET structure with and without a low resistance material filled in a gate region, according to an embodiment of the present invention.

Embodiments provide techniques for filling W or another low resistance metal in the gate region using a replacement spacer. FIG. 2, for example, shows the difference in structures formed with and without techniques described herein. FIG. 2 shows a top-down view 200, illustrating source/drain regions 204 and a gate 205. FIG. 2 also shows cross-sectional views 250 and 275 taken along line A-A for a structure formed with and without low resistance material filled in the gate region, respectively.

Cross-sectional view 250 shows a substrate 202, source/drain regions 204 and nanosheet channels 206. Gate regions or areas surround each of the nanosheet channels 206. The gate regions include spacers 208, dielectric layer 212 and WFM layer 214. A low resistance material 216 is formed in the gate region as illustrated. Spacer 210, also referred to as a capping layer, surrounds the WFM 214 and low resistance material 216 formed above the uppermost inner spacers 208.

Contacts 218 are formed to connect to source/drain regions 204. Spacers 208 and 210 provide isolation of the gates from the source/drain regions 204 and other conductive regions. The WFM 214 in the gate region completely surrounds each of the nanosheet channels 206. The relatively high resistance of the WFM 214 in the gate region, due to narrow line widths, can limit the operational characteristics of the device such as the switching speeds of the device. Advantageously, a material having a lower resistance than the WFM 214, such as W, is filled in the gate region using a replacement spacer as described below to reduce the gate resistance.

Low resistance material 216 may be W, or another material such as cobalt (Co) having comparatively low resistance relative to the resistance of the material used for the WFM 214. In some embodiments, the ratio of resistance between the low resistance material 216 and the WFM 214 is 1:100 or greater. The low resistance material 216, as an example, may be W having a resistivity of approximately $5 \times 10^{-8}$ ohm-metres ($\Omega$-m), while the WFM 214 may be titanium nitride (TiN) having a resistivity of approximately $50 \times 10^{-8}$ to $5000 \times 10^{-8}$ $\Omega$-m. The lower resistance material 216 may have a vertical thickness (in direction Y-Y') ranging from 10-30 nm, and a horizontal width (in direction X-X') ranging from 8-12 nm.

As shown, the WFM 214 is formed above the uppermost nanosheet channel 206, which ensures that the top sheet threshold voltage, determined by the thickness of the WFM material, is the same as the other nanosheet channels 206. In some embodiments, the minimum thickness of the WFM material between the nanosheet channels is equal to or larger than the thicknesses of the nanosheet channels 206. For ease of manufacturing, the thickness of the WFM material above the uppermost nanosheet channel 206 may be larger by a buffer in the range of 20-25 nm, to account for variations across the wafer. Generally, however, it is desired to shrink the WFM material formed above the uppermost nanosheet channel to achieve lower resistance and to reduce the aspect ratio of the gate.

Cross-sectional view 275 shows a structure, also including substrate source/drain regions 204, nanosheet channels 206, spacers 208 and 210, dielectric layer 212 and WFM 214, but without the low resistance material 216 formed as shown in cross-sectional view 250. Thus, the structure shown in cross-sectional view 275 will have larger gate resistance relative to the structure shown in cross-sectional view 250.

A process flow for forming the structure shown in cross-sectional view 250 will now be described in further detail with respect to FIGS. 3-13. The cross-sectional views shown in FIGS. 3-13 are each taken along the line A-A shown in the top-down view 200 of FIG. 2.

Figure 3:
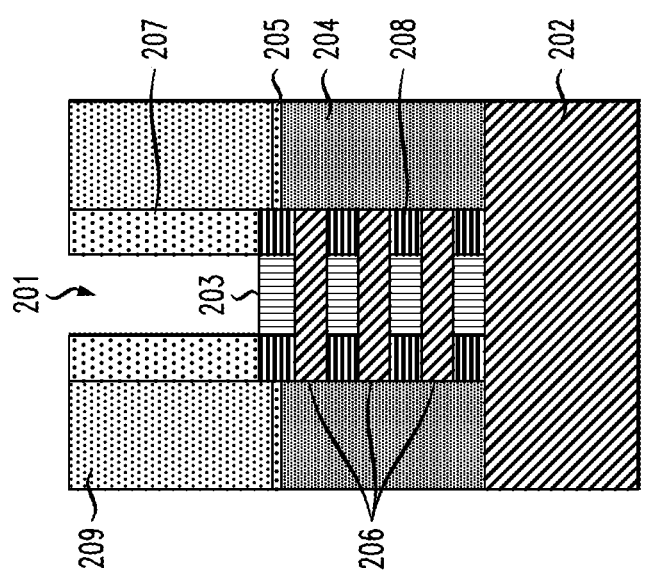
FIG. 3 depicts a cross-sectional view of a structure following removal of a dummy gate, according to an embodiment of the present invention.

FIG. 3 shows a cross-sectional view 300 of a structure following removal of a dummy gate and thick oxide (EG) removal. The dummy gate which is removed may be a dummy polysilicon gate formed in the blank space labeled 201. The EG is typically deposited before the dummy gate, so the EG is sandwiched between the dummy gate and the nanosheets. After removing the dummy gate, the EG oxide is removed before channel release. The EG removal step, however, may more generally be an oxide cleaning step following dummy gate removal and before channel release. While certain devices, such as I/O devices, are thick gate oxide devices, other devices such as logic devices may use thin gate oxides (SG).

The FIG. 3 structure includes substrate 202, source/drain regions 204, nanowire channels 206 and spacers 208 described above. The FIG. 3 structure further includes sacrificial layers 203, formed above and below each of the nanowire channels 206, spacers 205 formed over the source/drain regions 204, spacers 207 formed over the tops of the uppermost spacers 208, and oxide layers 209.

Substrate 202 may be formed of silicon (Si). The substrate 202 may have a vertical thickness (in direction Y-Y') ranging from 500-1000 micrometers (μm). The horizontal width of the substrate 202 (in direction X-X') may vary as desired, such as based on the number of gates or FET structures to be formed.

Source/drain regions 204 comprise epitaxial material, such as silicon germanium doped with boron (SiGe:B) and silicon doped with phosphorus (Si:P). The source/drain regions 204 may have a vertical thickness (in direction Y-Y') ranging from 30-100 nm.

Nanosheet channels 206 may be formed of Si. The nanosheet channels 206 may each have a vertical thickness (in direction Y-Y') ranging from 4-10 nm. Each nanosheet channel 206 may have a horizontal width (in direction X-X') ranging from 15-150 nm.

Spacers 208 may be formed of SiN, SiBCN, SiOCN or another suitable material. The spacers 208 may each have a vertical thickness (in direction Y-Y') ranging from 5-15 nm. Each spacer 208 may have a horizontal width (in direction X-X') ranging from 3-10 nm.

The sacrificial layers 203 may be formed of silicon germanium (SiGe), although other suitable materials may be used.

The spacers 205 may be formed of silicon nitride (SiN), although other suitable materials such as silicon boron carbon nitride (SiBCN) and silicon oxygen carbon nitride (SiOCN) may be used. The spacers 205 may have a vertical thickness (in direction Y-Y') ranging from 3-8 nm. The horizontal width (in direction X-X') of the spacers 205 may match that of the underlying source/drain regions 204.

The spacers 207, which may be referred to as outer spacers herein, may be formed of SiN although other suitable materials such as SiBCN and SiOCN may be used. Spacers 207 may have a vertical thickness (in direction Y-Y') which ranges from 80-100 nm. The horizontal width (in direction X-X') of the spacers 207 may match that of the underlying spacers 208.

The oxide layers 209 may be formed of silicon dioxide ($SiO_2$). As shown, the oxide layers 209 fill the structure, such that top surfaces of the oxide layers 209 are substantially coplanar with top surfaces of the outer spacers 207. Various oxide layers are described herein, each of which may be formed of $SiO_2$ although the quality and deposition conditions of such oxide layers may vary.

Figure 4:
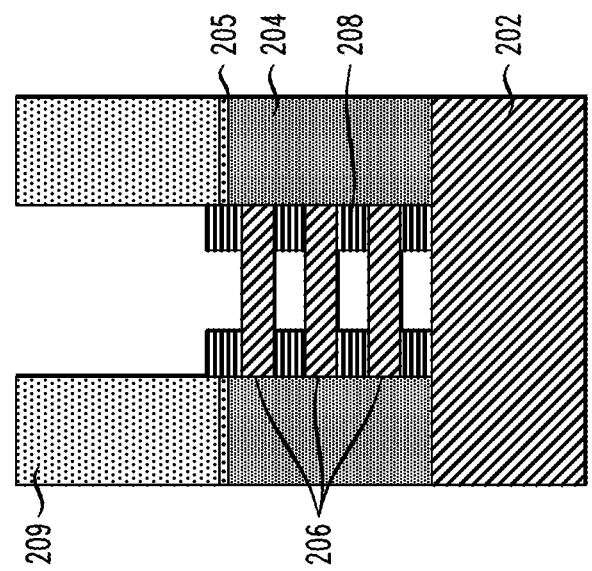
FIG. 4 depicts a cross-sectional view of the FIG. 3 structure following channel release, according to an embodiment of the present invention.

FIG. 4 shows a cross-sectional view 400 of the FIG. 3 structure following channel release. As shown, the outer spacers 207 are removed followed by release of the sacrificial layers 203. The outer spacers 207, which may be formed of SiN, are removed prior to the channel release of sacrificial layers 203, which may be formed of SiGe, to avoid damage to substrate 202. The outer spacers 207 may be removed using reactive-ion etching (RIE) or wet etching. The channel release of sacrificial layers 203 may utilize vapor hydrogen chloride (HCl) etch or another wet etch chemistry, configured to remove the material of sacrificial layers 203 selective to the material of nanosheet channels 206.

Figure 5:
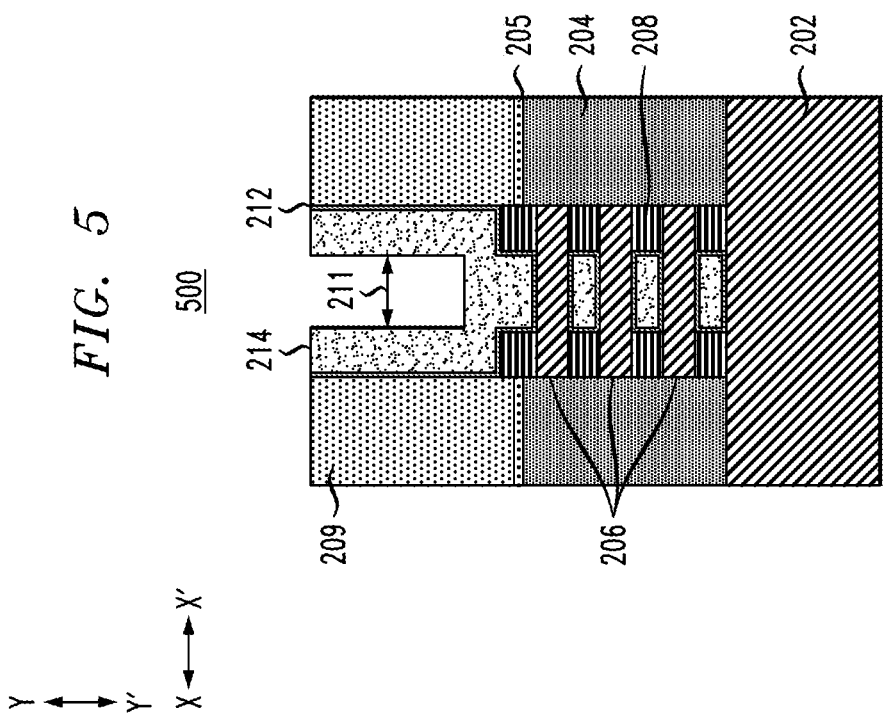
FIG. 5 depicts a cross-sectional view of the FIG. 4 structure following deposition of a dielectric layer and a work function metal, according to an embodiment of the present invention.

FIG. 5 shows a cross-sectional view 500 of the FIG. 4 structure following deposition of dielectric layer 212 and WFM 214. The dielectric layer 212 and WFM 214 may each be formed using a conformal deposition process. As illustrated, the dielectric layer 212 lines the exposed portions of the spacers 208, nanosheet channels 206 and oxide layers 209. The WFM 214 fills the remainder of the region between the spacers 208 above and below each of the nanosheet channels 206, as well as lining the dielectric layer 212 formed adjacent the oxide layers 209 as illustrated.

Dielectric layer 212 may be a high-k dielectric layer, such as hafnium dioxide ($HfO_2$), hafnium silicate (HfSiO), hafnium silicon oxy-nitride (HfSiON), etc. The dielectric layer 212 may have a uniform thickness (in both direction Y-Y' and X-X') ranging from 0.5-3 nm.

WFM 214 may be formed of TiN, although other suitable materials such as titanium carbide, (TiC), tantalum nitride (TaN), etc. may be used.

Because the outer spacers 207 were removed as illustrated in FIG. 4, there is sufficient room remaining to fill a low resistance material 216 such as W in subsequent processing following the conformal deposition of dielectric layer 212 and WFM 214. For example, the gap 211 remaining after conformal deposition of WFM 214 may have a horizontal width (in direction X-X') ranging from 8-12 nm. In some embodiments, the gap 211 has a horizontal width which matches that of the WFM 214 formed between the inner spacers 208 as illustrated.

Figure 6:
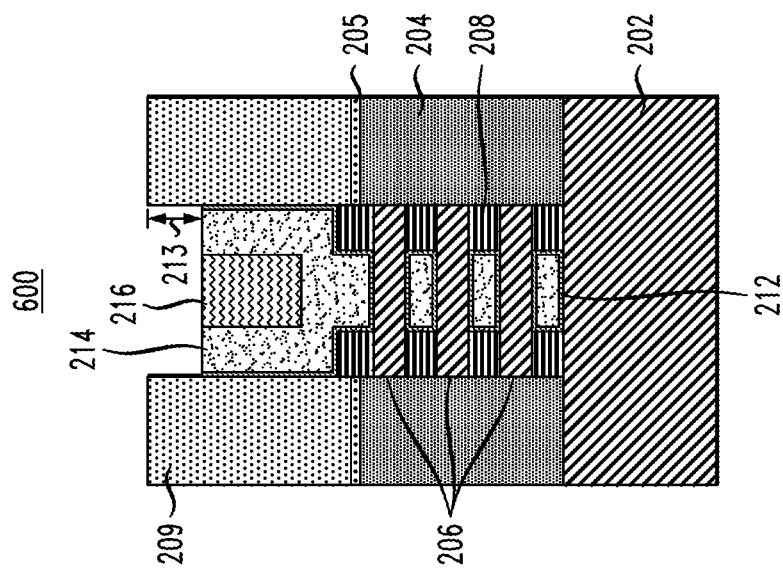
FIG. 6 depicts a cross-sectional view of the FIG. 5 structure following fill with a low resistance material and recess, according to an embodiment of the present invention.

FIG. 6 shows a cross-sectional view 600 of the FIG. 5 structure following fill with the low resistance material 216 and recess. Low resistance material 216 such as W is filled in the gap 211 using chemical vapor deposition (CVD). The dielectric 212, WFM 214, and low resistance material 216 is then recessed using chemical mechanical planarization (CMP) below top surfaces of the oxide layers 209. The recess may result in gap 213 being formed between the top surfaces of the oxide layers 209 and the top surfaces of the dielectric 212, WFM 214 and low resistance material 216. The gap 213 may have a vertical thickness (in direction Y-Y') ranging from 5-10 nm.

FIG. 7 shows a cross-sectional view 700 of the FIG. 6 structure following conformal deposition of oxide 215 over top surfaces of the oxide layers 209, dielectric 212, WFM 214 and low resistance material 216. The oxide 215 may be formed of $SiO_2$, using atomic layer deposition (ALD). The oxide 214 may have a thickness ranging from 1-3 nm.

FIG. 8 shows a cross-sectional view 800 of the FIG. 7 structure following etching to form oxide spacers 217 from the conformal oxide 215 previously deposited. The oxide 215 may be etched using a directional etch process, such as anisotropic RIE to form the oxide spacers 217. The oxide spacers 217 remaining after directional etch of the oxide 215 may have a horizontal width (in direction X-X') which matches that of the underlying dielectric layer 212 and WFM 214 as illustrated. The vertical thickness (in direction Y-Y') of the oxide spacers 217 ranges from 5-10 nm, such that the top surfaces of the oxide spacers 217 are substantially coplanar with the top surfaces of the oxide layers 209.

FIG. 9 shows a cross-sectional view 900 of the FIG. 8 structure following deposition of a capping layer 219. The capping layer 219 forms part of the spacers 210 in the resulting structure, as will be described in further detail below. The capping layer 219 may be formed by conformal deposition followed by CMP. The capping layer 219 may be formed of SiN, although other suitable materials such as SiBCN and SiOCN may be used. The top surface of the capping layer 219 may be substantially coplanar with the top surfaces of the oxide spacers 217 and the oxide layers 209 following CMP. The capping layer 219 may be a SiN self-aligned contact (SAC) capping layer.

FIG. 10 shows a cross-sectional view 1000 of the FIG. 9 structure following an oxide etch to remove the oxide spacers 217 and the oxide layers 209.

FIG. 11 shows a cross-sectional view 1100 of the FIG. 10 structure following etching of the dielectric 212 and WFM 214. This etching may be an anisotropic etch that is selective to the low resistance material 216 (e.g., selective to W). The capping layer 219 and the spacers 205 act as nitride masks for the isotropic etch, which may utilize RIE. The isotropic etch stops at the top surfaces of the uppermost spacers 208 as illustrated.

FIG. 12 shows a cross-sectional view 1200 of the FIG. 11 structure following formation of spacer 210, which may be formed by conformal deposition of additional material used in the capping layer 219, such as SiN, followed by anisotropic RIE.

Figure 13:
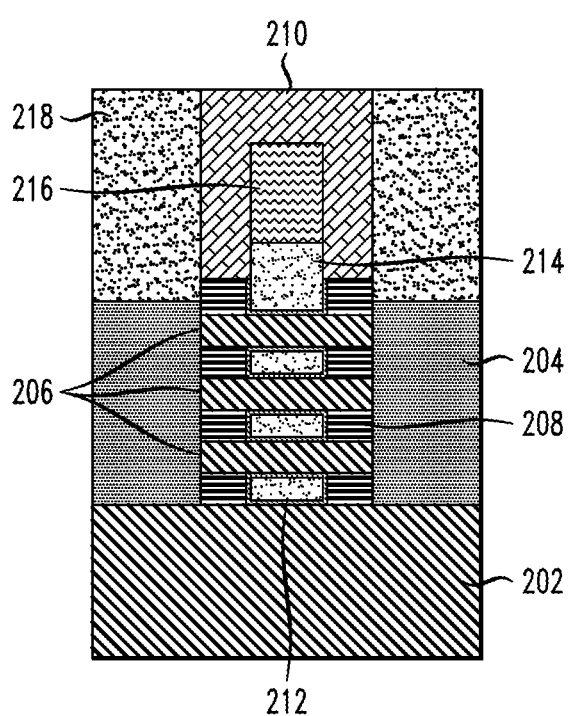
FIG. 13 depicts a cross-sectional view of the FIG. 12 structure following formation of contacts, according to an embodiment of the present invention.

FIG. 13 shows a cross-sectional view 1300 of the FIG. 12 structure following formation of contacts 218. The contacts 218 may be formed of W, Co or another suitable material, using chemical vapor deposition (CVD) or physical vapor deposition (PVD).

In some embodiments, a method of forming a semiconductor structure comprises forming outer spacers surrounding a dummy gate, the dummy gate being disposed over a channel stack comprising two or more nanosheet channels and sacrificial layers formed above and below each of the two or more nanosheet channels. The method also comprises forming an oxide surrounding the outer spacers, the oxide being disposed over source/drain regions surrounding the channel stack. The method further comprises removing the dummy gate, removing the outer spacers, and performing a channel release to remove the sacrificial layers in the channel stack following removal of the outer spacers. The method further comprises performing conformal deposition of a dielectric layer and a work function metal on exposed portions of the oxide, and filling a gate metal over the channel stack, the gate metal being surrounded by the work function metal.

The method may further comprise forming a substrate, forming the channel stack over a portion of the substrate, the channel stack comprising inner spacers formed at edges of the sacrificial layers formed above and below each of the two or more nanosheet channels, forming the source/drain regions surrounding the channel stack, forming the dummy gate over an uppermost sacrificial layer in the channel stack, forming the outer spacers over the inner spacers at edges of the uppermost sacrificial layer, and forming the oxide surrounding the outer spacers. The method may also comprise depositing the dielectric layer on exposed portions of the two or more nanosheet channels, the inner spacers and the oxide following the channel release and depositing the work function metal on the dielectric layer, the work function metal filling spaces above and below each of the nanosheet channels in the channel stack, and filling a region formed by removal of the outer spacers. In some embodiments, the deposition of the work function metal leaves empty space above a portion of the channel stack between the inner spacers, and wherein the gate metal is deposited in the empty space.

In some embodiments, the gate metal comprises tungsten (W). The gate metal has a lower resistance than the work function metal.

The method may include performing chemical mechanical planarization to recess the work function metal, the gate metal and the dielectric layer below a top surface of the oxide, and performing conformal deposition of an additional oxide over the top surface of the oxide and top surfaces of the work function metal, the gate metal and the dielectric layer. The additional oxide may be etched to remove portions of the additional oxide formed over the oxide and the gate metal to form oxide spacers over the top surfaces of the dielectric layer and the work function metal. Etching the additional oxide utilizes anisotropic reactive-ion etching.

In some embodiments, the method includes depositing a capping layer over the gate metal between the oxide spacers. Depositing the capping layer may comprise performing a conformal deposition of the capping layer and performing chemical mechanical planarization of the capping layer to remove portions of the capping layer formed over the oxide and the oxide spacers. An oxide etch may be performed to remove the oxide and the oxide spacers, followed by an anisotropic etch, selective to the gate metal, to remove portions of the work function metal and the dielectric layer exposed by the capping layer, the anisotropic etch stopping at a top surface of inner spacers formed over an uppermost one of the nanosheet channels in the channel stack. Additional material of the capping layer is deposited to surround the exposed gate metal and work function metal above the top surface of the inner spacers in some embodiments, wherein depositing the additional material of the capping layer comprises performing conformal deposition of the material of the capping layer followed by anisotropic reactive-ion etching. Contacts to the source/drain regions may be formed after deposition of the capping layer.

In some embodiments, a semiconductor structure comprises a substrate and a channel stack disposed over a portion of a top surface of the substrate, the channel stack comprising two or more nanosheet channels, inner spacers disposed above and below outer edges of the two or more nanosheet channels, work function metal disposed between the inner spacers above and below each of the two or more nanosheet channels, and dielectric disposed between the work function metal and the inner spacers and two or more nanosheet channels. The semiconductor structure further comprises source/drain regions disposed over the top surface of the substrate surrounding the channel stack, a gate region disposed over a top surface of the channel stack, the gate region comprising the work function metal and a gate metal disposed over the work function metal, a capping layer surrounding the gate region, and contacts to the source/drain regions surrounding the capping layer. The gate metal has a lower resistance than the work function metal.

In some embodiments, an integrated circuit comprises a semiconductor structure comprising a substrate and a channel stack disposed over a portion of a top surface of the substrate, the channel stack comprising two or more nanosheet channels, inner spacers disposed above and below outer edges of the two or more nanosheet channels, work function metal disposed between the inner spacers above and below each of the two or more nanosheet channels, and dielectric disposed between the work function metal and the inner spacers and two or more nanosheet channels. The semiconductor structure further comprises source/drain regions disposed over the top surface of the substrate surrounding the channel stack, a gate region disposed over a top surface of the channel stack, the gate region comprising the work function metal and a gate metal disposed over the work function metal, a capping layer surrounding the gate region, and contacts to the source/drain regions surrounding the capping layer. The gate metal has a lower resistance than the work function metal.

In the description above, various materials and dimensions for different elements are provided. Unless otherwise noted, such materials are given by way of example only and embodiments are not limited solely to the specific examples given. Similarly, unless otherwise noted, all dimensions are given by way of example and embodiments are not limited solely to the specific dimensions or ranges given.

It is to be understood that the various layers, structures, and/or regions described above are not necessarily drawn to scale. In addition, for ease of explanation one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular processing steps shown and described herein. In particular, with respect to semiconductor processing steps, it is to be emphasized that the descriptions provided herein are not intended to encompass all of the processing steps that may be used to form a functional semiconductor integrated circuit device. Rather, certain processing steps that are commonly used in forming semiconductor devices, such as, for example, wet cleaning and annealing steps, are purposefully not described herein for economy of description.

Terms such as "about" or "substantially" as used herein with regard to thicknesses, widths, percentages, ranges, etc., are meant to denote being close or approximate to, but not exactly. For example, the term "about" or "substantially" as used herein implies that a small margin of error may be present such as, by way of example only, 1% or less than the stated amount. Also, in the figures, the illustrated scale of one layer, structure, and/or region relative to another layer, structure, and/or region is not necessarily intended to represent actual scale.

Semiconductor devices and methods for forming same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require, for example, CMOSs, metal-oxide-semiconductor field-effect transistors (MOSFETs), and/or FinFETs. By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A semiconductor structure, comprising:
a substrate;
a multilayered channel stack disposed over a portion of a top surface of the substrate, the multilayered channel stack comprising two or more alternating nanosheet channels, and two or more alternating layers each disposed on the nanosheet channel, wherein each of the alternating layers disposed on the nanosheet channel comprises a central portion disposed between outer portions, wherein the central portion comprises a work function metal and a dielectric layer disposed around the work functional metal, and each of the outer portions comprises a spacer, wherein a top layer of the multilayered channel stack comprises one of the alternating layers which is configured to expose a top surface of the work function metal in the central portion;
source/drain regions disposed over the top surface of the substrate surrounding the multilayered channel stack;
a gate region disposed over a top surface of the central portion of the top alternating layer of the multilayered channel stack, the gate region comprising the work function metal in the central portion and a gate metal disposed over the work function metal;
a capping layer disposed on a top surface of the outer portions of the top alternating layer of the multilayered channel stack and surrounding the gate region; and
contacts to the source/drain regions surrounding the capping layer.

2. The semiconductor structure of claim 1, wherein the gate metal has a lower resistance than the work function metal.

3. The semiconductor structure of claim 1, wherein the work functional metal comprises titanium nitride (TiN), titanium carbide (TiC), or tantalum nitride (TaN).

4. The semiconductor structure of claim 1, wherein the gate metal has a lower resistance than the work function metal.

5. The semiconductor structure of claim 1, wherein the source/drain regions comprise epitaxial material.

6. The semiconductor structure of claim 5, wherein the epitaxial material comprises silicon germanium doped with boron (SiGe:B) or silicon doped with phosphorus (Si:P).

7. The semiconductor structure of claim 1, wherein the dielectric layer is a high-k dielectric layer.

8. The semiconductor structure of claim 1, wherein the capping layer comprises SiN, SiBCN or SiOCN.

9. The semiconductor structure of claim 1, wherein a minimum thickness of the work functional metal between the nanosheet channels is equal to or larger than the thicknesses of the nanosheet channels.

10. The semiconductor structure of claim 1, wherein the contacts comprise W or Co.

11. An integrated circuit comprising:
one or more semiconductor structures, wherein at least one semiconductor structure comprises:
a substrate;
a multilayered channel stack disposed over a portion of a top surface of the substrate, the multilayered channel stack comprising two or more alternating nanosheet channels, and two or more alternating layers each disposed on the nanosheet channel, wherein each of the alternating layers disposed on the nanosheet channel comprises a central portion disposed between outer portions, wherein the central portion comprises a work function metal and a dielectric layer disposed around the central portion work functional metal, and each of the outer portions comprises a spacer, wherein a top layer of the multilayered channel stack comprises one of the alternating layers which is configured to expose a top surface of the work function metal in the central portion;

source/drain regions disposed over the top surface of the substrate surrounding the multilayered channel stack;

a gate region disposed over a top surface of the top alternating layer of the multilayered channel stack, the gate region comprising the work function metal in the central portion and a gate metal disposed over the work function metal; and a capping layer disposed on a top surface of the outer portions of the top alternating layer of the multilayered channel stack and surrounding the gate region; and contacts to the source/drain regions surrounding the capping layer.

12. The integrated circuit of claim 11, wherein the gate metal has a lower resistance than the work function metal.

13. The integrated circuit of claim 11, wherein the work functional metal comprises TiN, TiC or TaN.

14. The integrated circuit of claim 11, wherein the gate metal has a lower resistance than the work function metal.

15. The integrated circuit of claim 11, wherein the source/drain regions comprise epitaxial material.

16. The integrated circuit of claim 15, wherein the epitaxial material comprises silicon germanium doped with boron (SiGe:B) or silicon doped with phosphorus (Si:P).

17. The integrated circuit of claim 11, wherein the dielectric layer is a high-k dielectric layer.

18. The integrated circuit of claim 11, wherein the capping layer comprises SiN, SiBCN or SiOCN.

19. The integrated circuit of claim 11, wherein a minimum thickness of the work functional metal between the nanosheet channels is equal to or larger than the thicknesses of the nanosheet channels.

20. The integrated circuit of claim 11, wherein the contacts comprise W or Co.

* * * * *